(12) United States Patent  (10) Patent No.: US 6,252,263 B1
Yoo  (45) Date of Patent: Jun. 26, 2001

(54) LAYOUT STRUCTURE FOR DYNAMIC RANDOM ACCESS MEMORY

(75) Inventor: Jei-Hwan Yoo, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/228,039

(22) Filed: Dec. 24, 1998

(30) Foreign Application Priority Data

Dec. 26, 1997 (KR) ................................................. 97-74206

(51) Int. Cl.⁷ .................................................. H01L 27/10
(52) U.S. Cl. ........................... 257/202; 257/210; 257/209
(58) Field of Search ................................... 257/260, 202, 257/203, 204, 206, 209, 210

Primary Examiner—Olik Chaudhuri
Assistant Examiner—Nathan W. Ha
(74) Attorney, Agent, or Firm—Jones Volentine, P.L.L.C.

(57) ABSTRACT

A layout structure of a semiconductor memory device having a memory cell array region, a word line drive region proximate the memory cell array, a bit line equalization region spaced apart from the memory cell array region, an impurity region formed between the memory cell array region and the bit line equalization region electrically coupled to the bit line equalization region, and a metal line extending over the impurity region supplying a bit line equalization voltage to the impurity region, wherein a contact connecting the metal line and the impurity region is formed lateral to the word line drive region rather than between the memory cell array region and the bit line equalization region.

10 Claims, 3 Drawing Sheets

LAYOUT STRUCTURE FOR DYNAMIC RANDOM ACCESS MEMORY

BACKGROUND OF THE INVENTION

1. Field of the Invention

The present invention relates to semiconductor memory devices. More particularly, the present invention relates to a layout structure for a dynamic random access memory (DRAM) in which bit line equalization transistors are provided with a bit line equalization voltage.

2. Description of the Related Art

In order to facilitate the fabrication of DRAMs, an effort has been continuously made to decrease the core and peripheral circuit regions provided with the memory cells and bit line sense amplifiers. For example and with reference to FIGS. 1 and 2, a conventional DRAM provided with stack memory cells, which consist of a storage poly and plate poly stacked over a semiconductor substrate, has a large offset between a cell array region 10 and a region 20 comprising bit line equalization transistors. This relationship makes it very difficult to form an active metal contact 21 to electrically connect metal line VBL(M1) and the active region 30 in order to supply a bit line equalization voltage VBL to bit line equalization regions 20 connected to the active region 30. In order to cope with this difficulty, plate poly 22 is extended to the edge of cell array region 10, as shown in FIG. 2, while the bit line transistors are arranged in bit line equalization region 20 and are separated from an edge of plate poly 22 by a space L. Metal contact 21 is then formed between metal line VBL(M1) and active region 30 to supply bit line equalization voltage VBL to the bit line equalization transistors.

However, since there exists a large offset between cell array region 10 and region 20 comprising the bit line equalization transistors, the metal contact 21 between the metal line VBL(M1) and an active n+region of the bit line equalization transistors is formed at a great distance from cell array region 10. This increases chip size. In fact, metal contact 21 becomes the bottle-neck of the overall metal-active ($n^+$ or $p^+$) contact process in the DRAM fabrication process, thus, increasing the size of the metal-active contact of the other regions so that the minimum distance between the metal-active contact and the gate must be increased in most of the transistors in the peripheral regions. Chip size necessarily increases.

Accordingly, the bit line equalization region 20 is a very critical place to design metal-active contacts in the DRAM. In addition, the metal-active contact between all the bit line equalization transistors and the metal line VBL(M1) supplying bit line equalization voltage VBL to the bit line equalization region 20 generates a contact overlap so as to reduce the metal line space, adversely affecting the metal line bridge margin, for example, the margins between active region 30 and plate poly 22, and active region 30 and the equalization metal line VBL(M1).

SUMMARY OF THE INVENTION

The present invention provides a layout structure for DRAM which secures proper margins for the metal contact and metal line to supply the bit line equalization voltage without increasing the chip size.

In one aspect the present invention provides a layout structure for a semiconductor memory device, comprising; a semiconductor substrate of first conductivity type having a main surface, a plurality of memory cell array regions arranged in a row on the main surface of the semiconductor substrate, a plurality of bit line equalization regions formed on the main surface of the semiconductor substrate lateral to and spaced apart from the plurality of memory cell array regions, such that each one of the plurality of bit line equalization regions defines a column perpendicular to the row, a word line drive region disposed in the row between adjacent memory cell array regions and between columns defined by adjacent bit line equalization regions, an impurity region of second conductivity type formed parallel to the row between the plurality of cell array regions and the plurality of bit line equalization regions on the main surface of the semiconductor substrate, the impurity region of second conductivity type being electrically coupled to the plurality of bit line equalization regions, a metal line extending over the impurity region of second conductivity type and supplying a bit line equalization voltage to the impurity region of second conductivity type, and a contact formed between the metal line and the impurity region of second conductivity type and disposed lateral to the word line drive region in a columnar direction.

In another aspect, the present invention provides a layout structure for a semiconductor memory device formed on a semiconductor substrate, comprising; a rectangular memory cell array region having a top edge, a bottom edge, and two lateral edges, wherein the top and bottom edges define a row-wise plane in the surface of the semiconductor substrate, and wherein the lateral edges define a columnar plane in the surface of the semiconductor substrate, a word line drive region proximate the rectangular memory cell array and disposed within the rowwise plane, a bit line equalization region spaced apart from the rectangular memory cell array region and disposed within the columnar plane, an impurity region formed between the rectangular memory cell array region and the bit line equalization region, and electrically coupled to the bit line equalization region, a metal line extending over the impurity region and supplying a bit line equalization voltage to the impurity region, and a contact connecting the metal line and the impurity region formed lateral to the word line drive region outside the columnar plane.

BRIEF DESCRIPTION OF THE ATTACHED DRAWINGS

The present invention may be better understood with its attendant advantages by reference to the following detailed description of the preferred embodiment and the accompanying drawings in which.

DETAILED DESCRIPTION OF THE PREFERRED EMBODIMENTS

Figure 1:
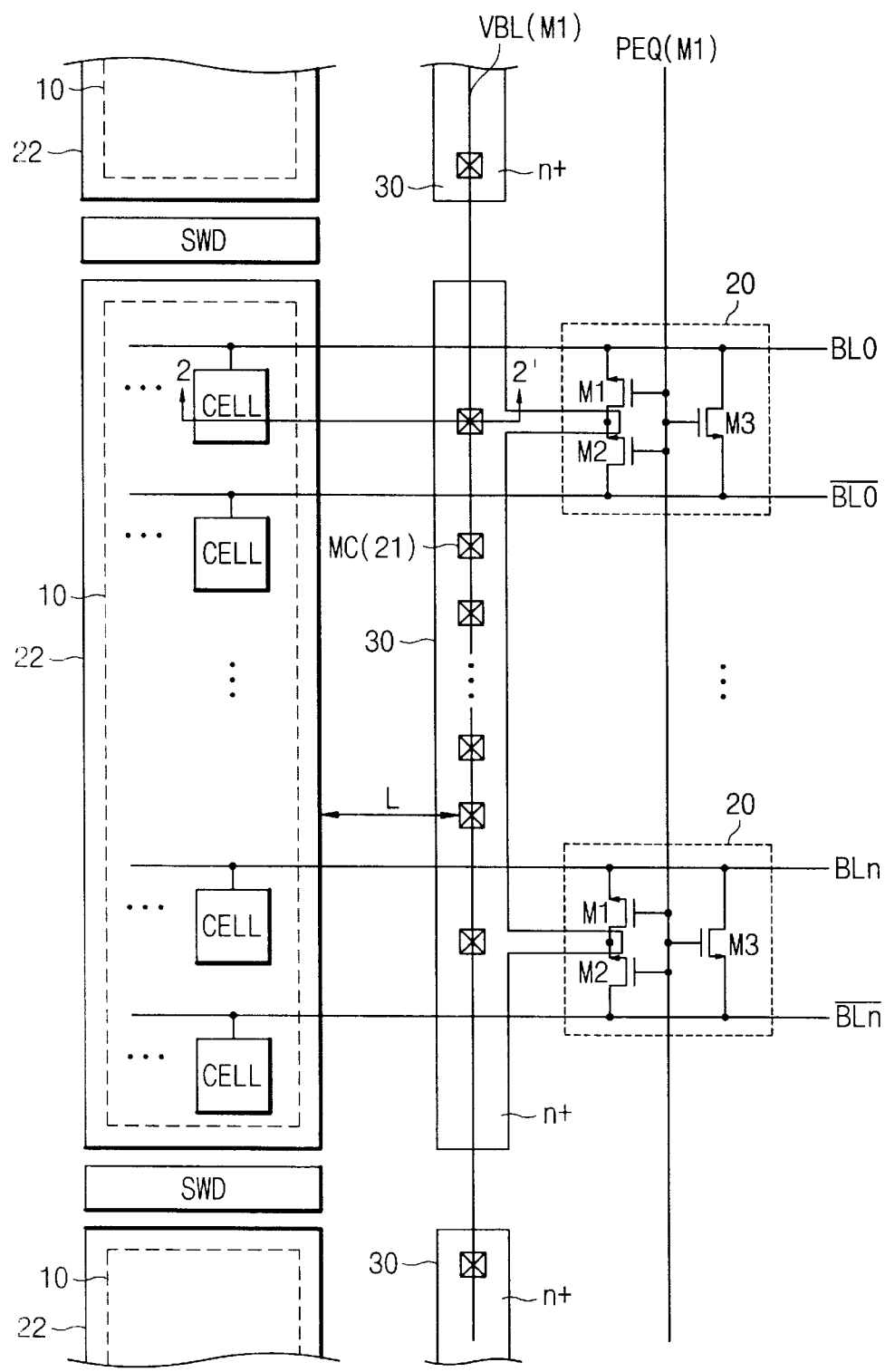
FIG. 1 is a conventional layout structure for a DRAM.
Figure 2:
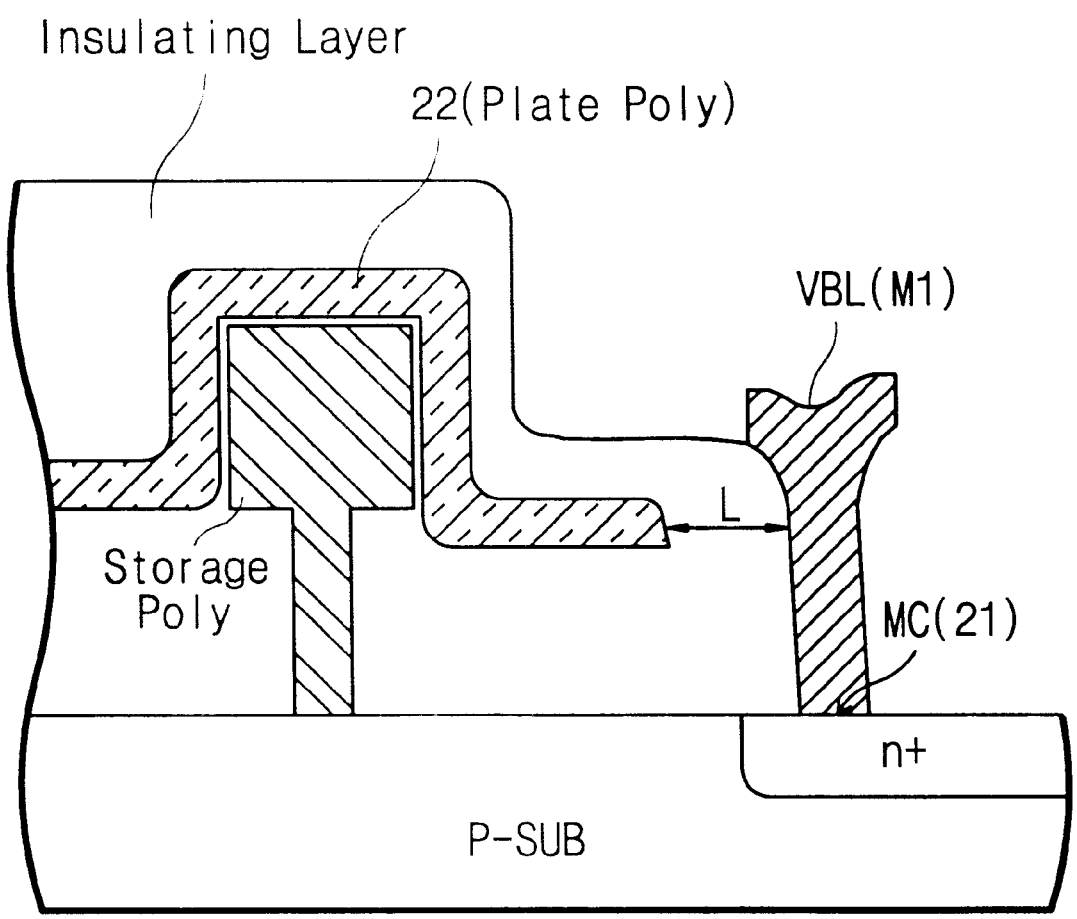
FIG. 2 is a cross sectional view taken along line 2–2' of FIG. 1.
Figure 3:
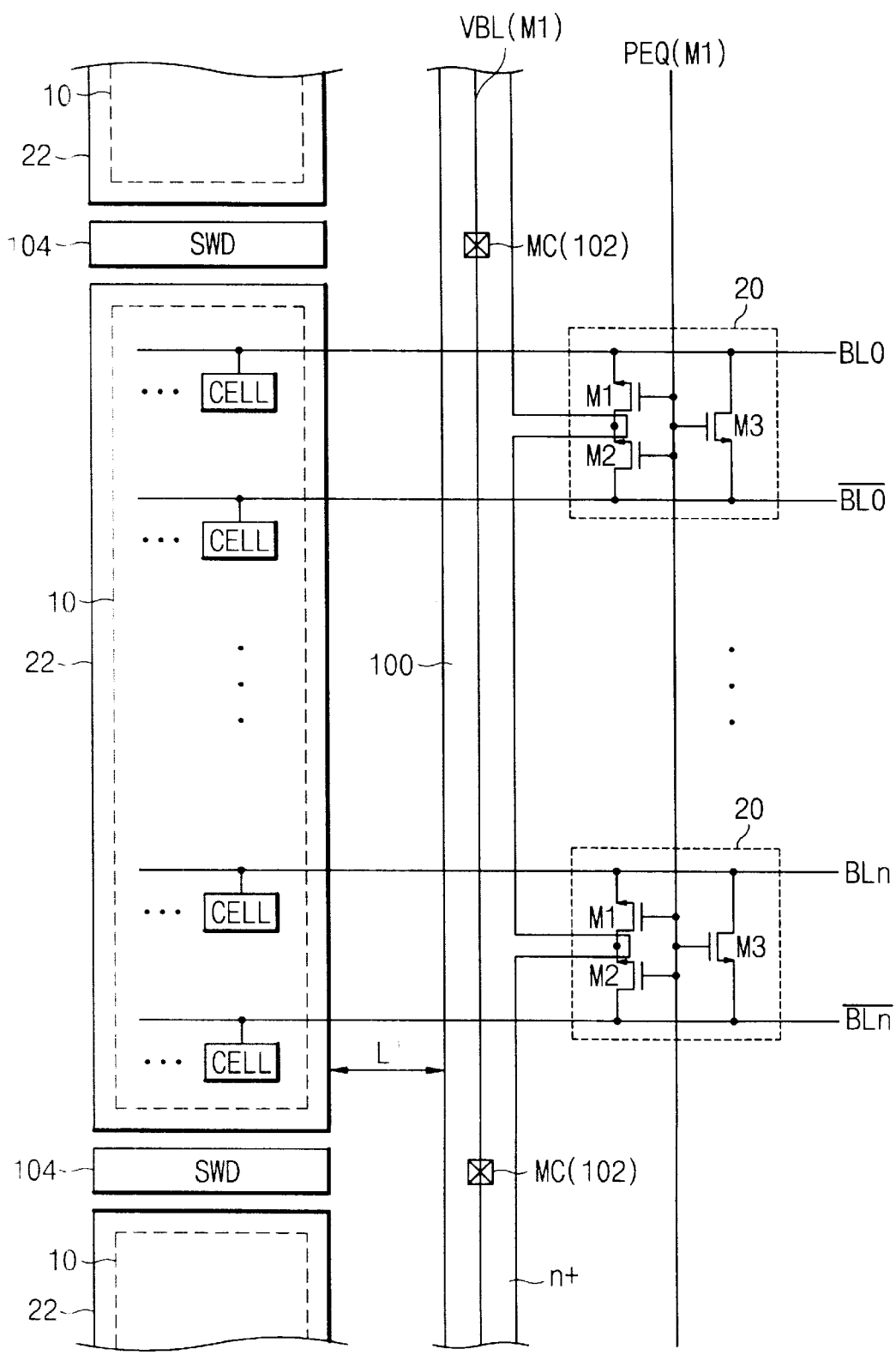
FIG. 3 is a layout structure of a DRAM according to the present invention.

Throughout the attached drawings similar reference indicators are used to identify similar components Referring to FIG. 3, an active region 100 is arranged between the cell array region 10 and bit line equalization region 20 in a direction perpendicular to bit lines (BLn, $\overline{BLn}$) on the main surface of a semiconductor substrate, and electrically connected to bit line equalization region 20. The metal-active contact 102 electrically connecting metal line VBL(M1) with active region 100 is formed only proximate word line drive region 104, i.e., formed in the logical intersections between word line drive regions 104 and bit line equalization regions 20, thus reducing the space between memory cell array region 10 and bit line equalization region 20, so that the chip size may be reduced even after securing sufficient process margin and metal line space. The memory cell regions 10 are arranged in rows and columns, including a plurality of memory cells, each of which consists of a stack capacitor and switching transistor. The memory cell array region 10 includes a plurality of word lines (not shown) in the rows and a plurality of bit lines BLn in columns, which are arranged in pairs BL0 and $\overline{BL0}$, BL1 and $\overline{BL1}$, ..., BLn and $\overline{BLn}$.

Of course, word line drive regions 104 are provided with the drive and coding circuit necessary to select and activate one of the word lines arranged in memory cell array region 10. The bit line equalization region 20 arranged in both sides of memory cell array region 10 is provided with three NMOS transistors M1, M2, and M3 controlled by equalization control signal line PEQ(M1) and the metal line VBL (M1) to equalize corresponding bit line pairs with an equalization voltage (for example, ½Vcc).

The current paths of the transistors M1, M2, and M3 are arranged between corresponding bit line pairs BLn and $\overline{BLn}$, and their sources and drains are electrically connected with the active region. As shown in FIG. 3, as equalization control signal line VBL(M1) goes high, transistors M1, M2, and M3 operate to equalize corresponding bit lines BLn and $\overline{BLn}$ with bit line equalization voltage VBL, for example, ½Vcc supplied from active region 100 through the metal line VBL(M1).

Active region 100 is formed on the main surface of the semiconductor substrate as an impurity region having the same conductive type as the sources and drains of the transistors M1, M2, and M3. Active region 100 is arranged in the word line direction along side memory cell array region 10 and word line drive region 104. Metal-active contact 102 formed in active region 100 is spaced apart from word line drive region 104 by space L'. Finally, metal-active contact 102 connecting metal line VBL(M1) and active region 100 is formed proximate word line drive region 104 rather than proximate the side of cell array region 10. Thus, a DRAM employing stack type capacitors where the offset of the memory cell region is greater than that of the peripheral and core regions, the space between the transistors M1, M2, and M3 of bit line equalization region 20 and memory cell array region 10 is considerably reduced compared to that of the conventional layout. This is achieved by the elimination of a metal-active contact between the bit line equalization region and the memory cell array region. Chip size is thus reduced. In addition, the elimination of metal-active contact 102 from the large offset region serves to improve the process margin as well as to considerably increase the metal line space because the contact overlap is eliminated.

The foregoing preferred embodiment has been given by way of example. While this invention has been particularly shown and described with reference to the preferred embodiments, it will be understood by those skilled in the art that various changes in form and details may be made without departing from the scope of this invention as defined by the attached claims.

What is claimed is:

1. A layout structure for a semiconductor memory device, comprising:

a semiconductor substrate of first conductivity type having a main surface;

a plurality of memory cell array regions arranged in a row on the main surface of the semiconductor substrate;

a plurality of bit line equalization regions formed on the main surface of the semiconductor substrate lateral to and spaced apart from the plurality of memory cell array regions, such that each one of the plurality of bit line equalization regions defines a column perpendicular to the row;

a word line drive region disposed in the row between adjacent memory cell array regions and between columns defined by adjacent bit line equalization regions;

an impurity region of second conductivity type formed parallel to the row and between the plurality of cell array regions and the plurality of bit line equalization regions on the main surface of the semiconductor substrate, the impurity region of second conductivity type being electrically coupled to the plurality of bit line equalization regions;

a metal line extending over the impurity region of second conductivity type and supplying a bit line equalization voltage to the impurity region of second conductivity type; and a contact that electrically couples the metal line to the impurity region of second conductivity types and that is disposed lateral to the word line drive region in a columnar direction, so that no contacts are formed directly between the plurality of memory cell array regions and the plurality of bit line equalization regions in the columnar direction.

2. A layout structure for a semiconductor memory device formed on a semiconductor substrate, comprising:

a rectangular memory cell array region having a top edge, a bottom edge, and two lateral edges, wherein the top and bottom edges define a row-wise plane in a surface of the semiconductor substrate, and wherein the lateral edges define a columnar plane in the surface of the semiconductor substrate;

a word line drive region proximate the rectangular memory cell array region and disposed within the row-wise plane;

a bit line equalization region spaced apart and disposed laterally from the rectangular memory cell array region within the columnar plane;

an impurity region formed between the rectangular memory cell array region and the bit line equalization region, and being electrically coupled to the bit line equalization region;

a metal line extending over the impurity region and supplying a bit line equalization voltage to the impurity region; and a contact that electrically couples the metal line to the impurity region and that is formed lateral to the word line drive region outside the columnar plane, so that no contacts are formed directly between the rectangular memory cell array region and the bit line equalization region in a columnar direction.

3. The layout structure for a semiconductor memory device of claim 2, wherein the impurity region extends continuously in a row-wise direction, such that the impurity region is lateral to the rectangular memory cell array region and the word line drive region.

4. The layout structure for a semiconductor memory device of claim 2, wherein the impurity region is either one of an N-type impurity region and a P-type impurity region.

5. A layout structure for a semiconductor device, comprising:

a plurality of memory cell array regions arranged along a first direction;

at least one word line drive region disposed in between the memory cell array regions;

a plurality of bit line equalization regions spaced apart from the plurality of memory cell array regions in a second direction, the second direction being perpendicular with respect to the first direction;

an impurity region formed in a substrate of the semiconductor device along the first direction, and in between the plurality of memory cell array regions and the plurality of bit line equalization regions, the impurity region being electrically coupled to the plurality of bit line equalization regions;

a metal line extending over the impurity region along the first direction; and at least one contact that electrically couples the metal line to the impurity region, such that no contacts are formed directly between the plurality of memory cell array regions and the plurality of bit line equalization regions along the second direction.

6. The layout structure for a semiconductor memory device of claim 5, wherein the semiconductor substrate is a first conductivity type and the impurity region is a second conductivity type.

7. The layout structure for a semiconductor memory device of claim 6, wherein the first conductivity type is N-type and the second conductivity type is P-type.

8. The layout structure for a semiconductor memory device of claim 6, wherein the first conductivity type is P-type and the second conductivity type is N-type.

9. The layout structure for a semiconductor memory device of claim 5, wherein the metal line supplies a bit line equalization voltage to the impurity region.

10. The layout structure for a semiconductor memory device of claim 5, wherein the semiconductor memory device is a DRAM.

* * * * *